(12) United States Patent
Sakurai et al.

(10) Patent No.: US 6,204,525 B1
(45) Date of Patent: Mar. 20, 2001

(54) FERROELECTRIC THIN FILM DEVICE AND METHOD OF PRODUCING THE SAME

(75) Inventors: Atsushi Sakurai, Kyoto; Xiao-min Li, Shiga-ken; Kosuke Shiratsuyu, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/156,478

(22) Filed: Sep. 18, 1998

(30) Foreign Application Priority Data

Sep. 22, 1997 (JP) .................................... 9-275244

(51) Int. Cl.[7] .................. H01L 29/76; H01L 29/04; H01L 23/48; H01L 21/31
(52) U.S. Cl. .................. 257/295; 257/627; 257/765; 438/763
(58) Field of Search .................. 257/295, 627, 257/765, 764, 740; 438/763

(56) References Cited

U.S. PATENT DOCUMENTS

| 5,406,123 | * | 4/1995 | Narayan | 257/767 |
| 5,504,041 | | 4/1996 | Summerfelt . | |
| 5,514,484 | * | 5/1996 | Nashimoto | 428/700 |
| 5,567,979 | * | 10/1996 | Nashimoto et al. | 257/627 |
| 5,760,474 | * | 6/1998 | Schuele | 257/754 |
| 5,838,052 | * | 11/1998 | McTeer | 257/437 |
| 5,976,946 | * | 11/1999 | Matsuki et al. | 438/393 |

FOREIGN PATENT DOCUMENTS 629461    2/1994   (JP) .

OTHER PUBLICATIONS

"Pulsed Laser Deposition of Epitaxial Ferrolectric Pb(Zr, Ti)O$_3$ Films on Si(100) Substrate"; Myung Bok Lee, et al.; Jpn. J. Apl. PHys. vol. 35 (1996) pp. L574–L576.

"Pulsed Laser Deposition of Epitaxial Ferrolectric Pb(Zr, Ti)O$_3$ Films on Si(100) Substrate"; Myung Bok Lee, et al.; J. Appl. Phys. vol. 35 (1996) Pt. 2, No. 5A; pp. L574–L576.

* cited by examiner

Primary Examiner—Matthew Smith
Assistant Examiner—Lex H. Malsawma
(74) Attorney, Agent, or Firm—Ostrolenk, Faber, Gerb & Soffen, LLP

(57) ABSTRACT

A ferroelectric thin film device comprises an Si substrate; a TiN thin film whose Ti component is partially replaced with Al, the TiN thin film being formed on the Si substrate; and a ferroelectric thin film of an oxide with a perovskite structure formed on the TiN thin film, wherein the amount of Al atoms present at Ti sites of the TiN thin film after partially replacing Ti with Al is within the range from about 1% to 30% and the oxygen atomic content of the TiN thin film is equal to or less than about 5%.

10 Claims, 11 Drawing Sheets

FERROELECTRIC THIN FILM DEVICE AND METHOD OF PRODUCING THE SAME

BACKGROUND OF THE INVENTION

1. Field of the Invention

The present invention relates to a ferroelectric thin film device and a method of producing the same, and more particularly to a ferroelectric thin film device applicable to a capacitor for use in a DRAM or a ferroelectric RAM (hereinafter referred to as a FeRAM), a pyroelectric device, a micro actuator, a thin film capacitor, a small-sized piezoelectric device, and the like and to a method of producing such a ferroelectric thin film device.

2. Description of the Related Art

In recent years, there have been intensive studies on thin films of perovskite compounds of Pb or other elements such as $BaTiO_3$ (hereinafter referred to simply as BTO), $SrTiO_3$ (hereinafter referred to simply as STO), $(Ba, Sr)TiO_3$ (hereinafter referred to simply as BSTO), $PbTiO_3$, $(Pb, La)TiO_3$ (hereinafter referred to simply as PLT), PZT, PLZT, and $Pb(Mg, Nb)O_3$ (hereinafter referred to simply as PMN), formed on an Si substrate. In particular, there is a great demand to grow an epitaxial thin film of a Pb-based perovskite compound such as PZT or PLZT having the property of great residual dielectric polarization thereby achieving spontaneous polarization aligned in one direction and thus achieving a greater polarization value and better switching characteristics. Such an epitaxial thin film will be extensively used as a high-density storage medium in various applications, and thus the development of a technique of growing such an epitaxial thin film is urgent.

In applications in which spontaneous polarization is aligned in one direction along the film thickness direction, it is required that a layer structure called an MFM (metal-ferroelectric-metal) structure consisting of a ferroelectric thin film sandwiched by electrically conductive layers (electrode layers) be formed on an Si substrate. In conventional techniques, however, it is difficult to form a triaxially-oriented ferroelectric oxide thin film having good crystal quality for the reasons described below.

First, when the conductive film on the Si substrate is realized using a metal film such as Ag, Au, or the like, oxidation occurs at the interface between the metal film and the ferroelectric oxide thin film and interdiffusion occurs between the metal film and the underlayer material, that is, the Si.

Second, when the metal film is formed using Pt, it is impossible to grow an epitaxial Pt film directly on an Si substrate although an epitaxial Pt film can be formed on an oxide single-crystal substrate such as MgO or $SrTiO_3$.

Third, when the conductive thin film is formed using an oxide such as $(La, Sr)CoO_3$ (hereinafter referred to as LSCO), it is necessary to form another layer between the Si substrate and the LSCO layer. A specific example of such a structure is PLZT/LSCO/BiTO/YSZ/Si. In this structure, however, it is difficult to form a high-quality epitaxial ferroelectric layer at the top of the structure. (BiTO is a short designation for $Bi_4Ti_3O_{12}$ and YSZ is a short designation for $ZrO_2$ doped with Y (yttrium)).

Fourth, with only one exception, no one has succeeded in growing a thin epitaxial layer of PZT, which is a Pb-based perovskite oxide ferroelectric, on an Si substrate. The exception is Koinuma et al. (Jpn. J. Appl. Phys. Vol. 135 (1996), L574) who grew an epitaxial layer of TiN on an Si substrate by means of a pulsed laser deposition (PLD) process at a low pressure (less than $10^{-7}$ Torr) and then formed an $SrTiO_3$ (STO) buffer layer thereon, and finally formed an epitaxial thin film of PZT at the top, wherein the STO layer on the TiN film was formed in the ambient vacuum at a pressure of $10^{-5}$ Torr (at 550° C.) which was quite different from the ambient (flow of ° 2 gas at 0.1 Torr at 450° C.) employed to form the PZT layer. In this technique, oxidation of the TiN layer was prevented by growing the STO with the perovskite phase at the ambient with an extremely low oxygen partial pressure.

The Koinuma et al technique has the following problems. It is necessary to employ an extremely low pressure of less than $10^{-7}$ Torr when an epitaxial thin film of TiN is grown on an Si substrate. To achieve such an extremely low pressure, it is necessary to use a high-quality vacuum system including a deposition chamber. Such a high-quality vacuum system is very expensive. Another problem of this technique is that to obtain a well-oriented PZT film, a buffer layer of STO, which behaves as a paraelectric at room temperature, is required between TiN and PZT layers.

In the conventional techniques, as described above, it is difficult to form a ferroelectric thin film of an oxide with a perovskite structure directly on an epitaxial layer serving as an electrode layer formed on an Si single-crystal substrate. In particular, it is very difficult to form a ferroelectric thin film of a Pb-based perovskite oxide in such a manner as to be oriented to a high degree (uniaxially or to a high degree).

SUMMARY OF THE INVENTION

Thus the primary object of the present invention is to provide a ferroelectric thin film device with a well-oriented simple-structure thin multilayer film including a layer of a ferroelectric oxide such as a Pb-based perovskite oxide formed on an Si single-crystal substrate, and to provide a method of producing such a ferroelectric thin film device.

The ferroelectric thin film device comprises: an Si substrate; a TiN thin film whose Ti component is partially replaced with Al formed on said Si substrate; and a ferroelectric thin film of an oxide with a perovskite structure formed on said TiN thin film. The amount of Al atoms present at Ti sites of said TiN thin film after partially replacing Ti with Al is within the range from about 1% to 30% and the oxygen atomic content of said TiN thin film is equal to or less than about 5%. Preferably, the amount of Al atoms present at Ti sites of said TiN thin film is within the range from about 5% to 20% and the oxygen atomic content of said TiN thin film is equal to or less than about 1%.

The method of producing a ferroelectric thin film device, comprises the steps of: epitaxially growing a TiN thin film whose Ti component is partially replaced with Al; and growing a ferroelectric thin film of an oxide with a perovskite structure in an orientationally ordered fashion on said TiN thin film, wherein the amount of Al atoms present at Ti sites of said TiN thin film after partially replacing Ti with Al is within the range from about 1% to 30% and the oxygen atomic content of said TiN thin film is equal to or less than about 5%.

According to the present invention, it is possible to epitaxially grow a TiN thin film serving as a barrier metal layer on an Si single-crystal substrate at a pressure higher than used in the conventional technique. This technique allows a ferroelectric layer of a perovskite oxide, which is very difficult to form in accordance with any conventional technique, to be epitaxially grown on an Si single-crystal substrate. Thus, according to the present invention, it is possible to achieve a ferroelectric thin film device with a well-oriented ferroelectric layer of an oxide and more particularly a Pb-based perovskite oxide formed on an Si single-crystal substrate. The ferroelectric thin film device according to the present invention is applicable not only to a DRAM or a FeRAM but also to other various devices such as a pyroelectric device, a micro actuator, a thin film capacitor, a small-sized piezoelectric device, etc.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Figure 1A:
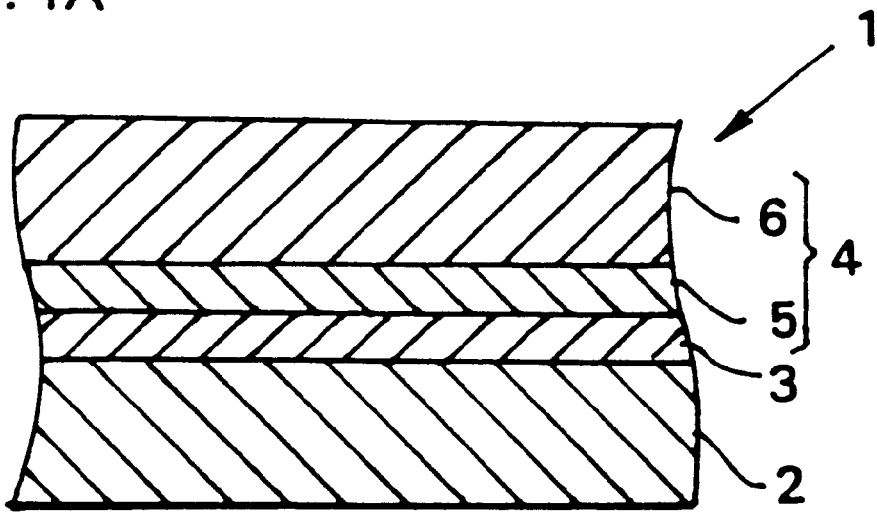
FIG. 1A shows a cross sectional view of a ferroelectric thin film device according to an embodiment of the present invention.

The inventors of the present invention have found that if atoms at the Ti sites of TiN are replaced with Al, then a high quality epitaxial layer of TAN can be grown on an Si substrate without requiring a very low pressure, such as an absolute pressure of $10^{-7}$ Torr or lower. Herein, a compound obtained by partially replacing atoms at Ti sites of TiN with Al is referred to as TAN.

If the amount of Ti replaced with Al is less than about 1 atm %, then the improvement in the resistance to oxidation is not sufficient. On the other hand, if the amount of Ti replaced with Al is greater than about 30 atm %, then the result is a great reduction in the conductivity of TAN. Thus the preferable range is from about 1 atm % to 30 atm %.

If the oxygen content of the TAN thin film is greater than about 5%, the TAN thin film formed on an Si substrate becomes poor in oxidation resistance and in epitaxial crystal quality. To avoid such a problem, it is preferable that the oxygen content of the TAN thin film be less than about 5 atm % and more preferably less than about 1 atm %. To obtain a TAN thin film with an oxygen content less than about 5 atm %, the growth of the TAN thin film should be performed at a pressure lower than about $1 \times 10^{-6}$ Torr. This requirement in terms of the pressure is eased by one order of magnitude compared to the requirement that a pressure of $1 \times 10^{-7}$ Torr or lower be used to form TiN whose Ti component is not replaced with Al at all. That is, the present invention makes it possible to epitaxially grow an electrode layer (TAN) serving as a barrier metal layer on an Si single-crystal substrate at a pressure higher than that used in the conventional technique. Although there is no particular limitation in terms of the thickness of the TAN film, it is desirable that the thickness be determined within the range from about 100 nm to 10 pm taking into account the fact that the resistivity of the TAN film is one to two orders of magnitude greater than other widely-used metals. The use of the TAN film as the electrode layer makes it possible to easily form a well-oriented (uniaxially or to a high degree) ferroelectric thin film directly on the TAN film.

The TAN film thus obtained are still likely to be oxidized. On the other hand, the oxide ferroelectric thin film formed on the TAN film has an excellent crystallinity if a sufficient amount of oxygen exists during the growth of the ferroelectric thin film by the MOCVD method. Therefore, when a ferroelectric thin film comprising a ferroelectric oxide is formed in the TAN film by a MOCVD method, it is preferable that the ferroelectric thin film comprises an initial layer which is formed on the TAN film under the existence of less excess oxygen and a main layer which is formed on the initial layer under the existence of excess oxygen.

In addition, when the TAN thin film is heated at a temperature more than 300° C. during the period after the TAN is formed on the Si substrate and before the ferroelectric thin film is applied, the atmosphere to which the TAN thin film is exposed is preferably maintained such that the oxygen partial pressure and the water partial pressure of the atmosphere are at $1 \times 10^{-5}$ Torr and $1 \times 10^{-5}$ Torr or less, respectively.

Hereinafter, the preferred embodiments of the present invention are explained in more detail with reference to the drawings.

Referring to FIG. 1A a ferroelectric thin film device 1 comprises a Si substrate 2, a TiN thin film 3 formed on the Si substrate 2 and a ferroelectric thin film 4 of an oxide with a perovskite structure formed on the TiN thin film 3. In the TiN thin film 3, Ti is partially replaced with Al, and the amount of Al atoms present at Ti sites of the TiN thin film after partially replacing Ti with Al is within the range from about 1% to 30%. The oxygen atomic content of the TiN thin film 3 is preferably equal to or less than about 5%.

In the ferroelectric thin film device 1 according to the present invention, the TiN thin film 3 whose Ti component is partially replaced with Al is epitaxially grown and the ferroelectric thin film 4 is grown in an orientationally ordered fashion, and preferably in the c-axis direction.

The ferroelectric thin film 4 comprises an initial layer 5 formed on the TiN thin film 3 and a main layer 6 formed on the initial layer 5. Both of the initial layer 5 and the main layer 6 are made of the same material and preferably a Pb-based perovskite compound, and more preferably a Pb-based perovskite compound represented by a general formula of $ABO_3$ (where the constituent element A is Pb or Pb and at least La and the constituent element B is at least one element selected from the group consisting of Ti, Zr, Mg and Nb).

The ferroelectric thin film 4 is preferably grown by means of epitaxial growth, and more preferably by a chemical vapor deposition (CVD) method such that the c-axis of the ferroelectric thin film 4 is perpendicular to the surface of the Si substrate 2. Such a CVD method includes a metal organic CVD (MOCVD), a plasma CVD, a laser CVD or the like.

The thickness of the initial layer 5 is preferably within the range of about 5 to 50 nm. If the thickness is less than about 5 nm, the main layer 6 cannot be epitaxially grown on the TiN thin film 3 due to the oxidation of the TiN thin film. If the thickness is greater than about 50 nm, main layer 6 likely becomes oxygen deficient.

The TiN thin film whose Ti component is partially replaced with Al is preferably formed by means of a laser deposition process, although it may also be formed by means of a sputtering process or a reactive deposition process. The advantage of the laser deposition process is that the pressure can be controlled independently of other parameters. The laser deposition process may employ a target material whose Ti component is partially replaced with Al at a pressure equal to or lower than about $1\times10^{-6}$ Torr. Alternatively, two separate targets of TiN and AlN may be employed instead of the single target. In this case, the two targets are alternately used at the appropriate rates.

The Si substrate has a crystal orientation of (100), (111) or (110) with a miscut angle of equal to or less than 5%. A single crystal substrate made of MgO, $SrTO_3$ or $MgAl_2O_3$ may be employed.

Figure 1B:
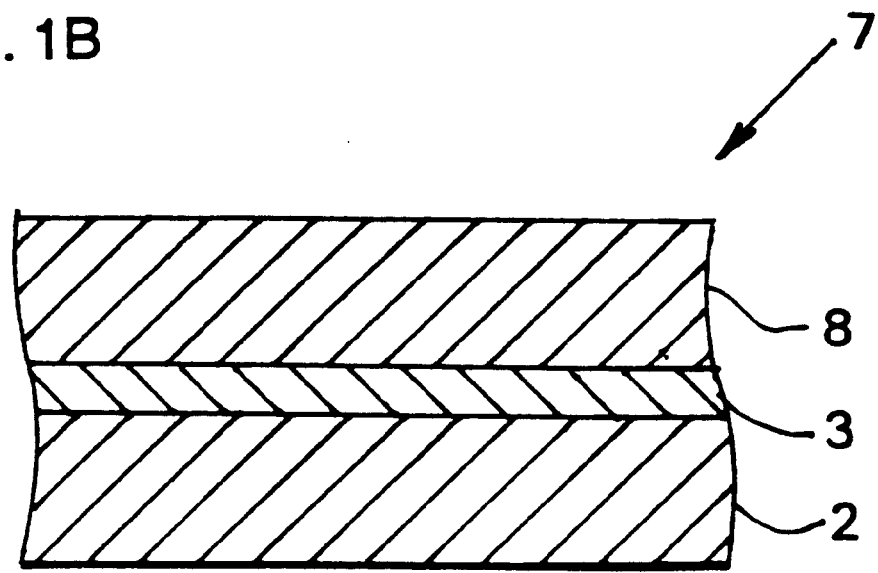
FIG. 1B shows a cross sectional view of a ferroelectric thin film device according to another embodiment of the present invention.

FIG. 1B shows a ferroelectric thin film device 7 according to another embodiment of the present invention. The ferroelectric thin film device 7 comprises a Si substrate 2, a TiN thin film 3 formed on the Si substrate 2 and a ferroelectric thin film B. The ferroelectric thin film device 7 shown in FIG. 1B is different form the ferroelectric thin film device 1 shown in FIG. 1A in that the ferroelectric thin film 8 has a substantial uniform composition in its thickness and is entirely formed under constant conditions. It is preferable that the ferroelectric thin film 8 is formed by a pulsed laser deposition method.

Hereinafter, the preferred embodiments of the present invention are explained in more detail with reference to the drawings.

In the respective embodiments and comparative examples described below, after removing a native oxide from the surface of an Si single-crystal substrate, a TAN thin film and then a ferroelectric thin film of a Pb-based perovskite oxide were formed on the Si single-crystal substrate thereby forming an oriented ferroelectric thin film device. After that, an upper electrode of Au with a diameter of 0.5 mm was formed on each ferroelectric oxide thin film by means of a vacuum evaporation process using a mask, and the electric characteristics of the ferroelectric thin film devices were evaluated.

Figure 2:
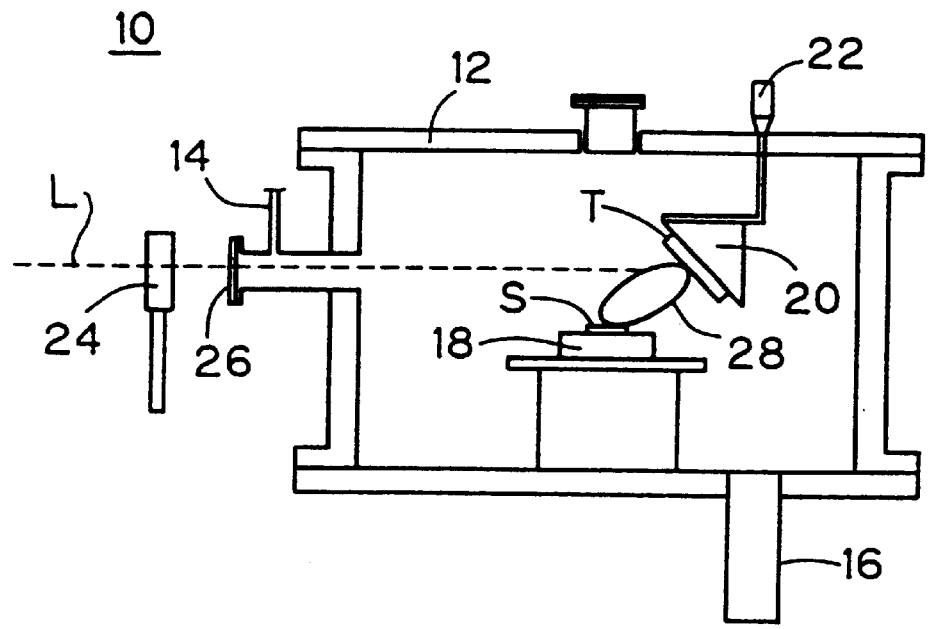
FIG. 2 is a schematic diagram illustrating an example of a PLD apparatus used to form a TAN thin film in the examples according to the present invention and also in a comparative example.

FIG. 2 is a schematic diagram illustrating an example of a PLD apparatus used to form the TAN thin film, PLT thin film, and BSTO thin film in the embodiments and comparative examples described below. The PLD (Pulsed Laser-Deposition) apparatus 10 of the conventional type used herein is briefly described below. The PLD apparatus 10 includes a vacuum chamber 12. Gas is supplied into the vacuum chamber 12 through a gas inlet pipe 14, and unnecessary gas is exhausted through an exhaust pipe 16. In the vacuum chamber 12, an Si single-crystal substrate S (hereinafter referred to simply as a substrate) is placed on a substrate heater 18. A target T is held by a target holder 20 at a location deviated in an oblique direction above the substrate S. The target holder 20 is supported by a driving manipulator 22 for adjusting the position of the target T. An excimer laser beam L is introduced into the vacuum chamber 12 through a synthetic quartz window 26, wherein the excimer laser beam L is focused onto the target T through a laser condensing lens 24. A trace of particles 28 is sputtered from target T to substrate S. Thus a TiN thin film is formed on the substrate S.

Figure 3:
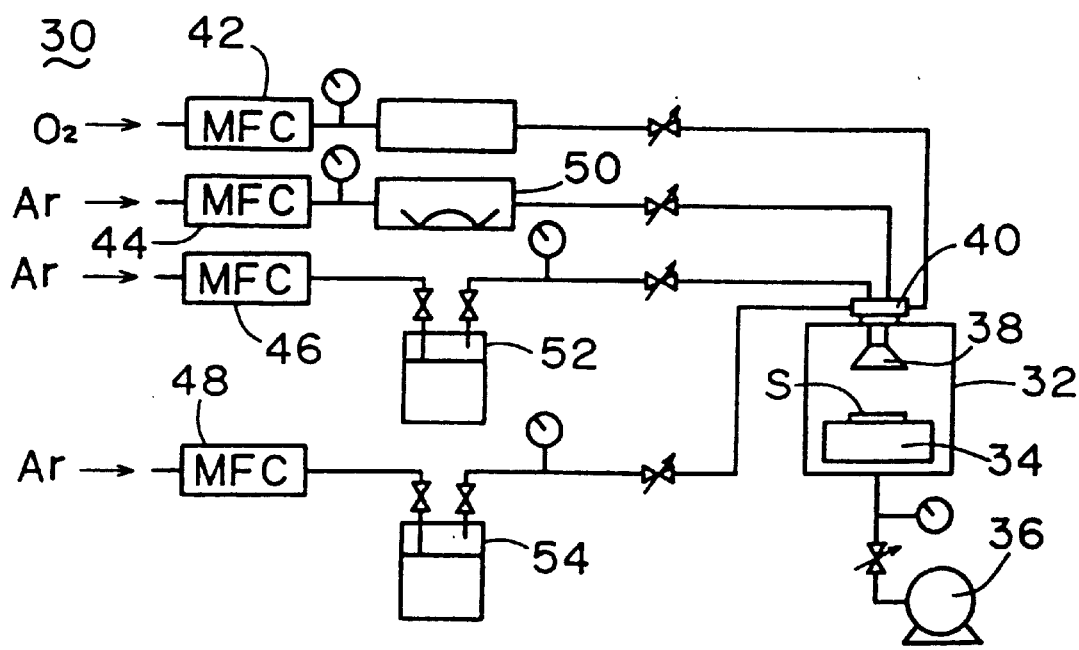
FIG. 3 is a schematic diagram illustrating an example of an MOCVD apparatus used to form a PZT thin film in the examples according to the present invention and also in the comparative example.

FIG. 3 is a schematic diagram illustrating an example of an MOCVD apparatus used to form the PZT thin film in the embodiments and comparative examples described below. The MOCVD apparatus 30 of the conventional type used herein is briefly described below. The MOCVD apparatus 30 includes a vacuum chamber 32. In the vacuum chamber 32, a substrate S is placed on a substrate heater 34. The vacuum chamber 32 is connected to a vacuum pump such as a mechanical booster pump 36. A source gas is supplied into the vacuum chamber 32 through a gas effusion nozzle 38. A gas mixer 40 is connected to the gas effusion nozzle 38. In the case where a PZT thin film is formed, four gas supply lines are connected to the gas mixer 40. The first gas supply line is used to supply $O_2$ gas through a mass flow controller (hereinafter referred to simply as an MFC) 42. Through the second gas supply line, Pb vaporized by a solid vaporizer 50 is carried by Ar gas serving as a carrier gas supplied through an MFC 44. Through the third gas supply line, Zr vaporized by a liquid vaporizer 52is carried by Ar gas serving as a carrier gas supplied through an MFC 46. Through the fourth gas supply line, Ti vaporized by a liquid vaporizer 54 is carried by Ar gas serving as a carrier gas supplied through an MFC 48. The gases supplied into the gas mixer 40 through these four gas supply lines are mixed in the gas mixer 40, and the mixed gas pyrolytically decomposes and burns above the substrate S. As a result, a PZT thin film grows on the substrate S.

EXAMPLE 1

A (100) Si wafer two inches in diameter was used as the Si substrate. The (100) Si substrate was cleaned by means of an ultrasonic cleaning process in an organic solvent such as acetone or ethanol. The Si substrate was then immersed in a 10% HF solution so as to remove an oxide film from the surface of the Si substrate. After that, a TAN ($Ti_{0.9}Al_{0.1}N$)

thin film with a thickness of about 100 to 500 nm was epitaxially grown on the Si single-crystal substrate by means of a laser deposition process using the PLD apparatus shown in FIG. 2 under the conditions of ambient vacuum (at a pressure of about $1\times10^{-6}$ Torr); substrate temperature of 550° C. to 650° C; laser repetition frequency of 5 to 10 Hz; and laser energy density of 4.5 J/cm$^2$ (KrF). As for the target used to form the TAN thin film, sintered TAN with a composition of $(Ti_{0.9}Al_{0.1})N$ was employed. It is preferable that the relative density of the sintered TAN be greater than about 90%, and more preferably greater than about 95%.

Although it has been confirmed that a TAN thin film can be epitaxially grown in an ambient vacuum even at a rather high pressure of the order of $1\times10^{-5}$ Torr, it is required that the pressure be lower than about $1\times10^{-6}$ Torr to obtain a TAN thin film with high crystal quality and to achieve good orientational order in a Pb-based ferroelectric thin film.

The oxygen content of the obtained TAN thin film was measured using Auger electron spectroscopy (AES). The measured oxygen content was less than 1 atm %.

Figure 4:
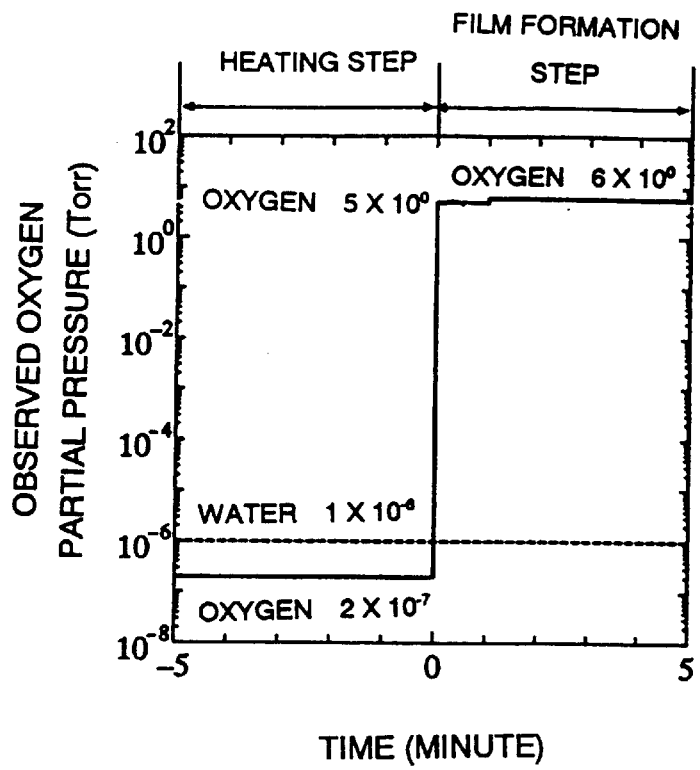
FIG. 4 shows an observed-oxygen partial pressure and a water partial pressure during the formation of the PZT thin film in Example 1.
Figure 5:
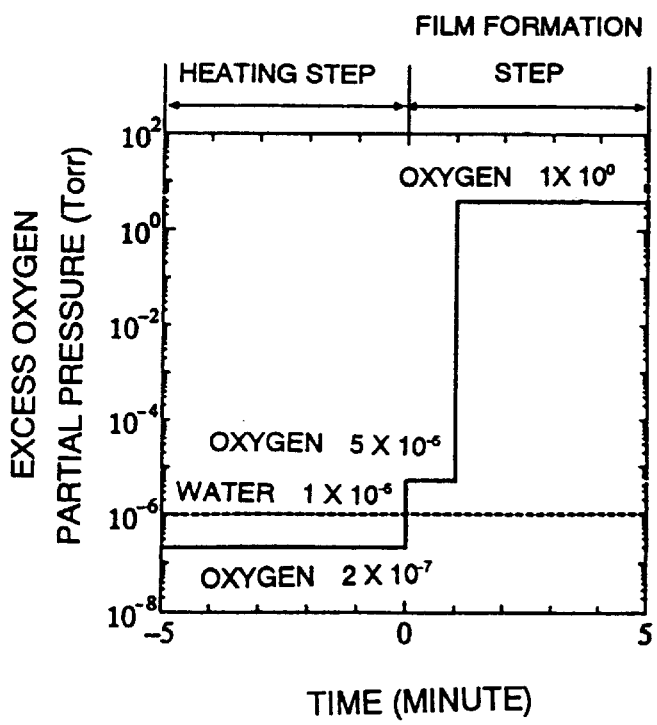
FIG. 5 shows an excess-oxygen partial pressure and a water partial pressure during the formation of the PZT thin film in Example 1.

Furthermore, using the MOCVD apparatus 30 shown in FIG. 3, $Pb(Zr_{0.52}Ti_{0.48})O_3$ (PZT) thin film with a thickness of 400 to 600 nm was epitaxially grown on the TAN thin film by means of a chemical vapor deposition process at a substrate temperature of 700° C. and at a total pressure of 10 Torr. $Pb(DPM)_2$, $Zr(O-t-C_4H_9)_4$, and $Ti(O-i-C_3H_7)_4$ were employed as precursors for Pb, Zr, and Ti, respectively. The detailed production conditions for the PZT thin film are shown in Table 1 and FIGS. 4 and 5. FIG. 4 shows the observed-oxygen partial pressure and water partial pressure. FIG. 5 shows the excess-oxygen partial pressure and water partial pressure. The excess-oxygen pressure is calculated by subtracting the oxygen amount which is required to decompose the precursors and to form the PZT without causing an oxygen deficiency from the oxygen amount based on an observed-oxygen partial pressure.

TABLE 1

|  | Vaporization Temperature | Flow Rate of Carrier Gas | Vaporizer Pressure |
| --- | --- | --- | --- |
| Pb source | 130° C. | 200 SCCM(Ar) | 10 Torr |
| Zr source | 35° C. | 100 SCCM(Ar) | 10 Torr |
| Ti source | 50° C. | 100 SCCM(Ar) | 100 Torr |
| Oxygen gas | — | 400–600 SCCM | |

During raising of the substrate temperature to 700° C., the vacuum chamber 32 was evacuated by the vacuum pump 36 which maintains the oxygen partial pressure and the water partial pressure at $2\times10^{-7}$ Torr and $1\times10^{-6}$ Torr, respectively. Note that oxygen was supplied to neither the vacuum chamber 32 nor the precursors.

When the substrate temperature reached to 700° C., the precursors are supplied at the predetermined flow rates into the vacuum chamber 32 by using the MFC 44, 46 and 48. Also, oxygen is supplied into the vacuum chamber 32 so that the observed oxygen partial pressure was kept at 5 Torr. This condition was maintained for one minute, thereby forming the initial layer 5 of the PZT having a thickness of about 40 nm on the TiN thin film 3. The excess-oxygen partial pressure during the formation of the initial layer 5 was $5\times10^{-5}$ Torr, which means there is no substantial excess oxygen in the vacuum chamber 32.

Then, the observed oxygen partial pressure was adjusted to 6 Torr, and the total pressure was adjusted to 10 Torr. The excess-oxygen partial pressure became 1 Torr. During the period, the main layer 6 of the PZT was formed on the initial layer 5.

Figure 6:
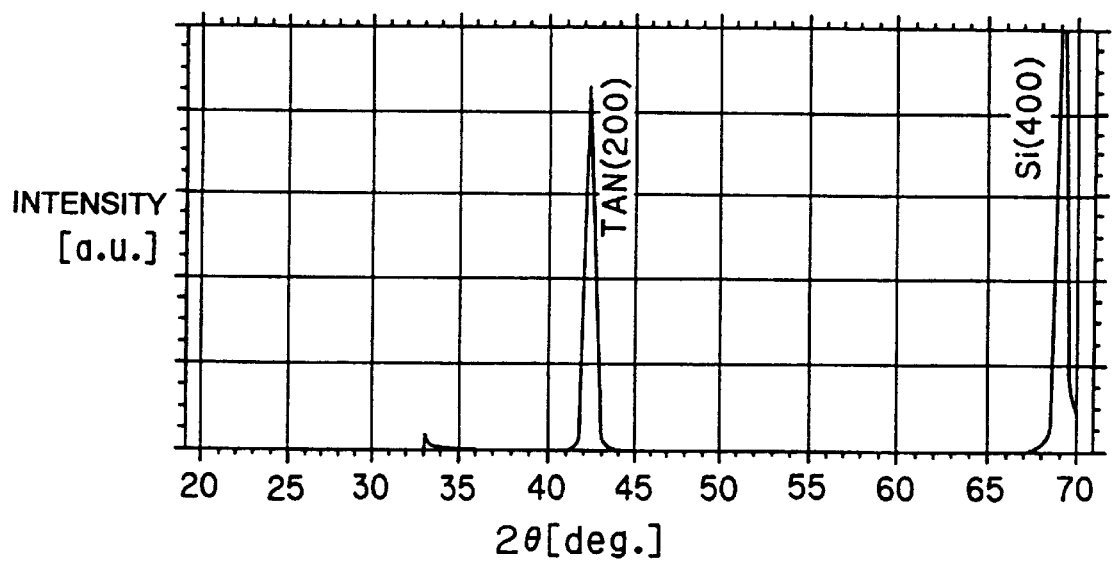
FIG. 6 shows an XRD pattern of a TAN thin film formed according to Example 1.
Figure 7:
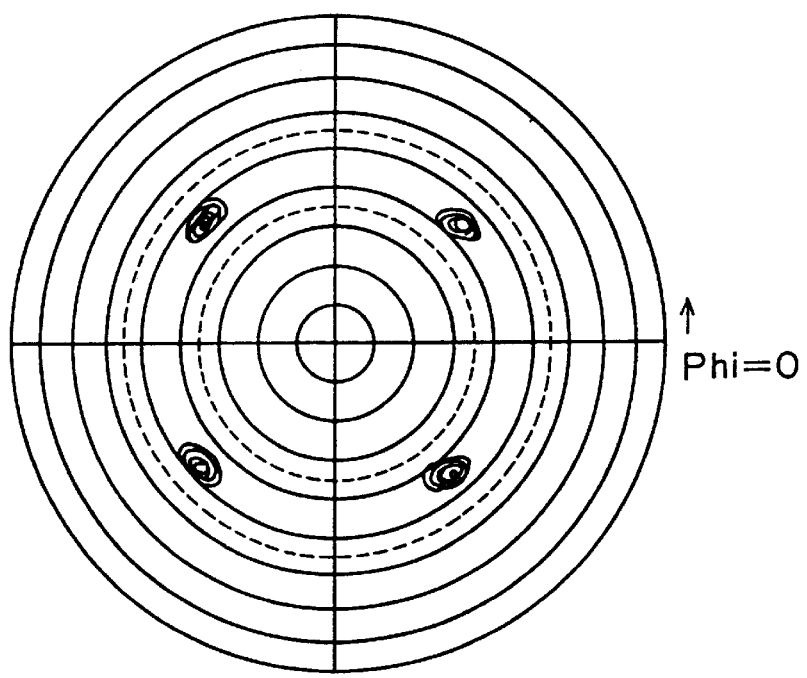
FIG. 7 is a pole figure of the TAN thin film formed according to Example 1.

FIG. 6 illustrates an X-ray diffraction (XRD) pattern of the TAN thin film formed on the Si substrate in this Example 1. In this figure, "a.u." is a shorthand for "arbitrary units". FIG. 7 is a pole figure showing the orientation across a single film. This analysis was performed on a (220) TAN film. The result exhibits four-fold symmetric peaks which indicate that a high-quality epitaxial TAN thin film with a high degree of orientation is formed on the Si substrate.

Figure 8:
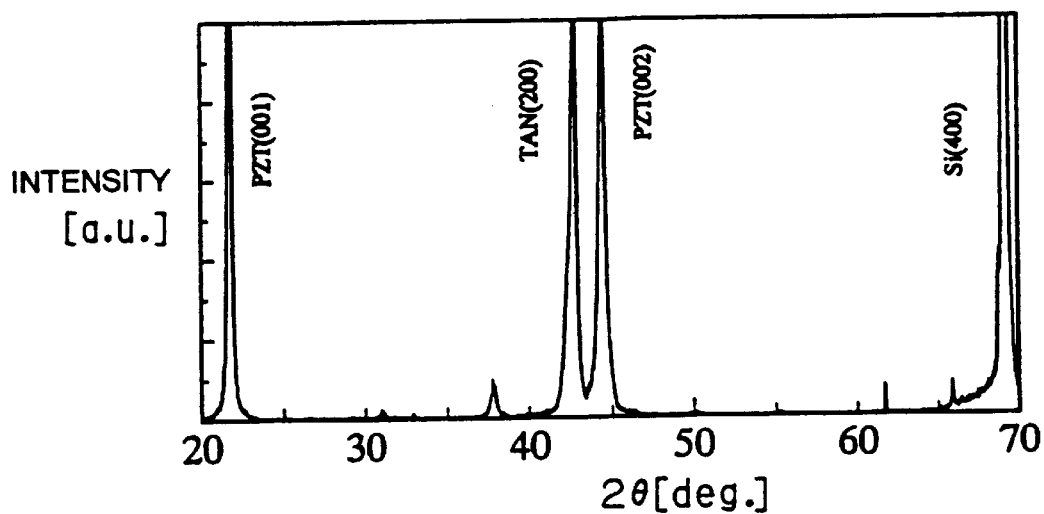
FIG. 8 shows an XRD pattern of an epitaxial PZT thin film produced in Example 1.
Figure 9:
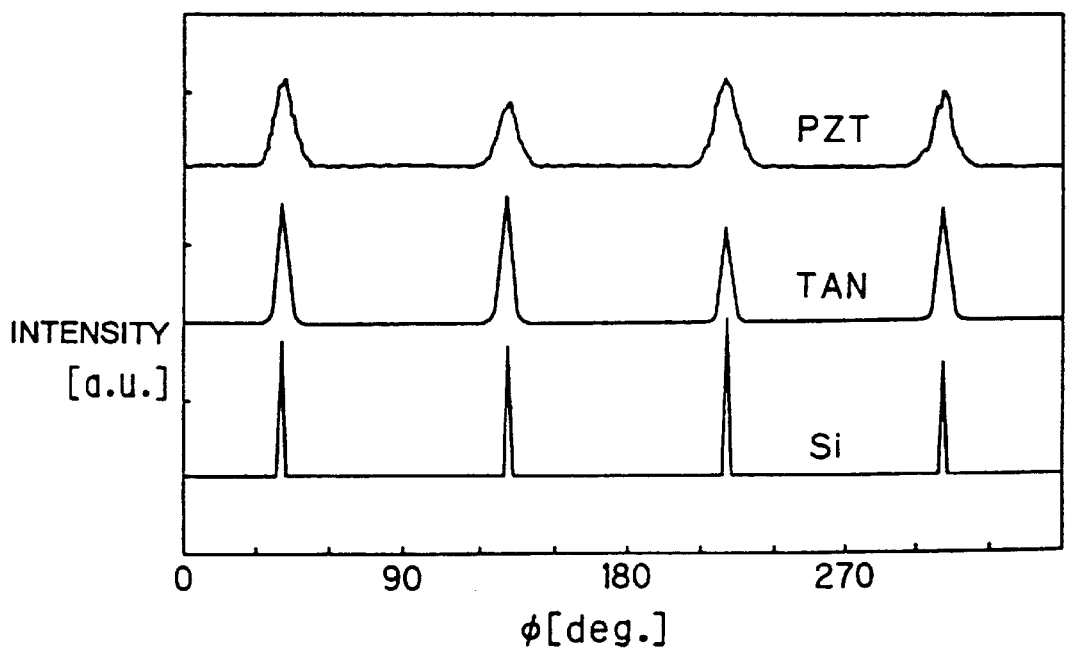
FIG. 9 shows a 360°-scanned pattern of the epitaxial PZT thin film produced in Example 1.

FIG. 8 illustrates an XRD pattern of the epitaxial PZT thin film formed on the TAN thin film. FIG. 9 shows a 360°-scanned pattern representing the degree of orientation of the whole thin film with a multilayer structure of PZT/TAN/Si. Although the epitaxial crystallinity becomes slightly poor in the upper layers compared to the lower layers, epitaxial growth with a high degree of orientation is achieved over all layers up to the top layer of PZT thin film.

Figure 10:
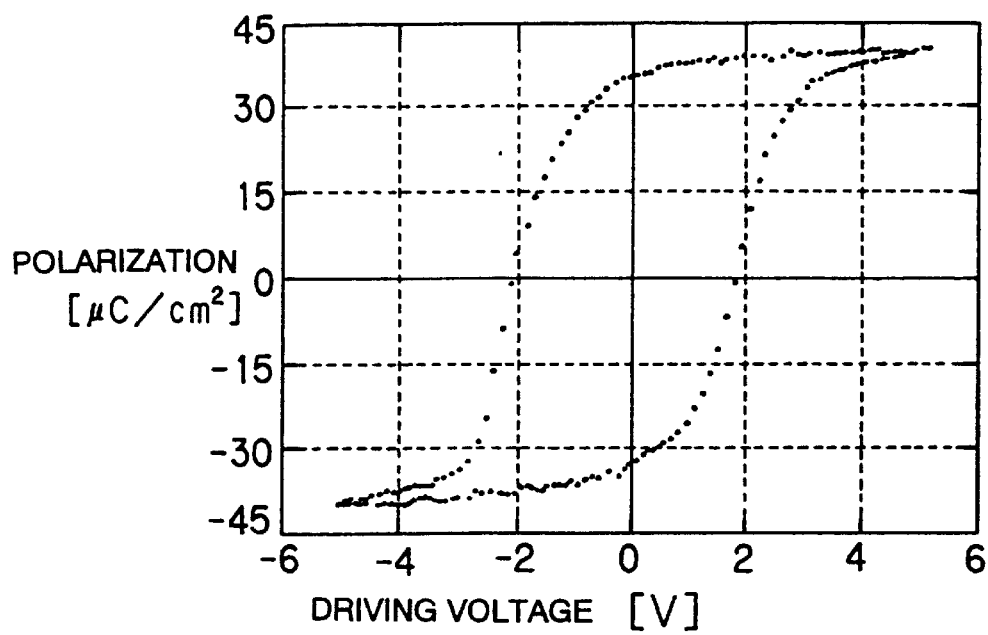
FIG. 10 shows a P-E hysteresis loop of the epitaxial PZT thin film produced in Example 1.

FIG. 10 shows a P-E hysteresis loop of the epitaxial PZT thin film obtained in this Example 1.

As clearly shown in FIGS. 8–10, the PZT ferroelectric thin film formed on the TAN thin film has excellent crystallinity and electromagnetic properties.

Table 2 shows the electric characteristics evaluated for the PZT thin film devices obtained in Example 1. As can be seen from Table 2, the ferroelectric thin film device has excellent electric characteristics.

TABLE 2

| Sample | tan δ (%)* | Relative Dialectic Constant ($\epsilon_r$) | Remark |
| --- | --- | --- | --- |
| Example 1 | 2.0 | 450 | Thickness 500 nm |
| Comp. Exp. 1 | 5.1 | 150 | Thickness 500 nm |

*tan δ (%) and $\epsilon_r$ were measured at 0.1 V and at 1 kHz.

COMPARATIVE EXAMPLE 1

A TAN $(Ti_{0.9}Al_{0.1}N)$ thin film with a thickness of about 100 to 500 nm was epitaxially grown on an Si single-crystal substrate by means of the PLD method under the conditions: a pressure of about $1\times10^{-5}$ Torr (i.e., higher than in Example 1); a substrate temperature of 550 to 650° C.; a laser repetition frequency of 5 Hz; and a laser energy density of 4.5 J/cm$^2$ (KrF). The oxygen content of the obtained TAN thin film was measured using the AES technique as in Example 1. The measured oxygen atomic content was about 10%. Furthermore, using the MOCVD technique as in Example 1, $Pb(Zr_{0.52}Ti_{0.48})O_3$ (PZT) thin film with a thickness of 300 to 600 nm was epitaxially grown on the TAN thin film by means of a chemical vapor deposition process at a total pressure of 10 Torr (with an oxygen partial pressure of 5 Torr) and at a substrate temperature of 600° C.

Figure 11:
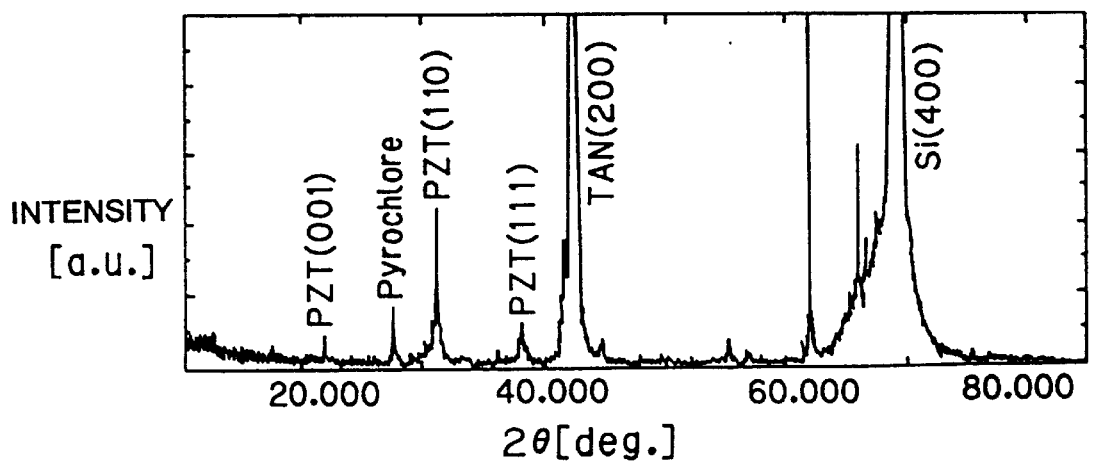
FIG. 11 shows an XRD pattern of the PZT thin film produced in an comparative example 1.

FIG. 11 illustrates an XRD pattern of the epitaxial PZT thin film formed on the TAN thin film according to Comparative Example 1. As is understood from FIG. 11, the PZT thin film exhibits a perovskite phase, but is not oriented along a particular axis. This means that the PZT thin film was not epitaxially grown. Table 2 shows the electric characteristics evaluated for the PZT thin film according to Comparative Example 1 are poor.

This comparative example reveals that the TAN thin film containing oxygen at about 10% has a poor crystallinity and that an PZT thin film cannot be epitaxially grown on the TAN thin film.

COMPARATIVE EXAMPLE 2

A TAN $(Ti_{0.9}Al_{0.1}N)$ thin film with a thickness of about 100 to 500 nm was epitaxially grown on an Si single-crystal substrate by means of the PLD method under the same conditions as that employed in Example 1.

Figure 12:
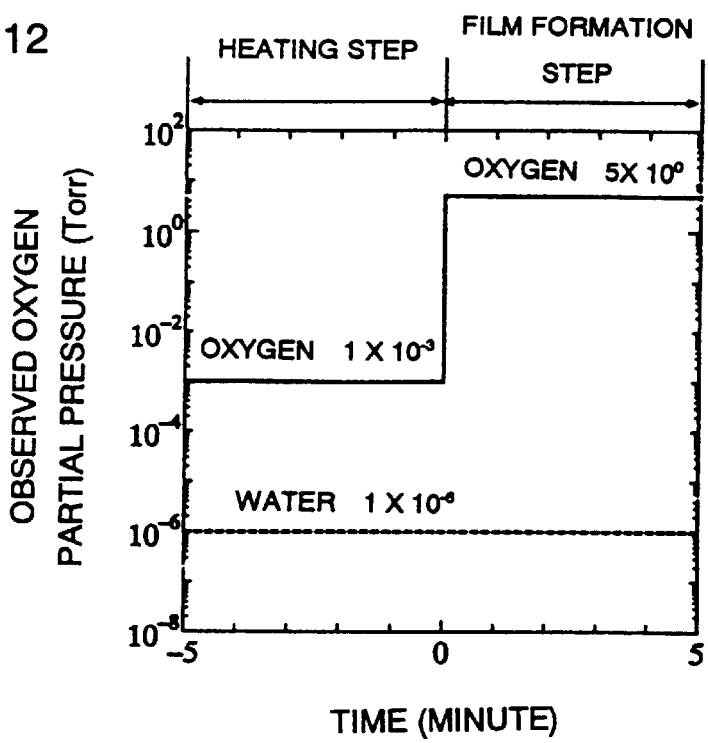
FIG. 12 shows an observed-oxygen partial pressure and a water partial pressure during the formation of the PZT thin film in Comparative example 2.
Figure 13:
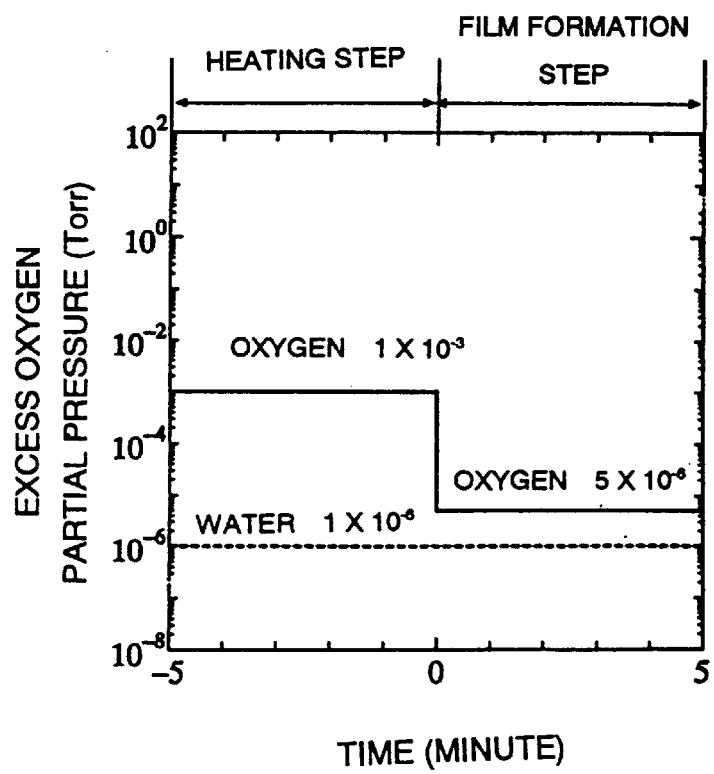
FIG. 13 shows an excess-oxygen partial pressure and a water partial pressure during the formation of the PZT thin film in Comparative example 2.

Then, the substrate was heated to reach to 700° C. while the oxygen partial pressure and the water partial pressure maintained at $10^{-3}$ Torr and $10^{-6}$ Torr, respectively as shown in FIGS. 12 and 13. Thereafter, the PZT thin film was formed on the TAN thin film, at the observed oxygen partial pressure of 5 Torr and at the excess-oxygen partial pressure of $5\times10^{-6}$ Torr. Note that the observed oxygen partial pressure and the excess-oxygen partial pressure were made constant during the PZT thin film formation. Thus, no initial layer of PZT was formed.

Figure 14:
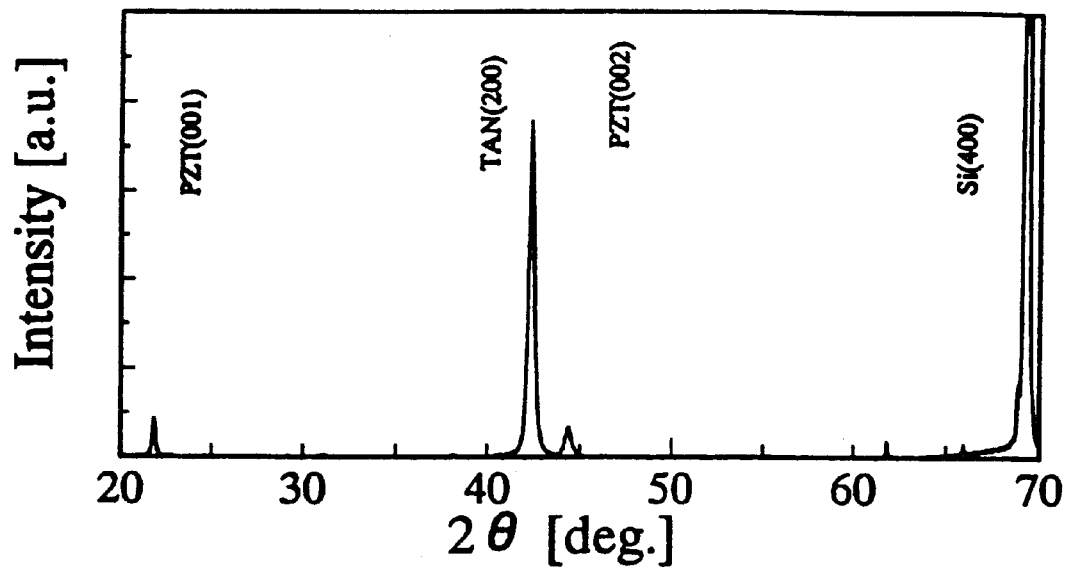
FIG. 14 shows an XRD pattern of an epitaxial PZT thin film produced in Comparative example 2.

FIG. 14 illustrates the XRD pattern of the epitaxial PZT thin film formed on the TAN thin film according to Comparative Example 2. FIG. 14 shows that the PZT thin film according to Comparative Example 2 exhibits orientational properties in some degree, but the diffraction intensity is very weak. This is because the surface of the TAN thin film is oxidized during heating the substrate before the formation of the PZT thin film and the oxide layer interposed between the TAN thin film and the PZT thin film prevents the PZT thin film from epitaxially growing.

Figure 15:
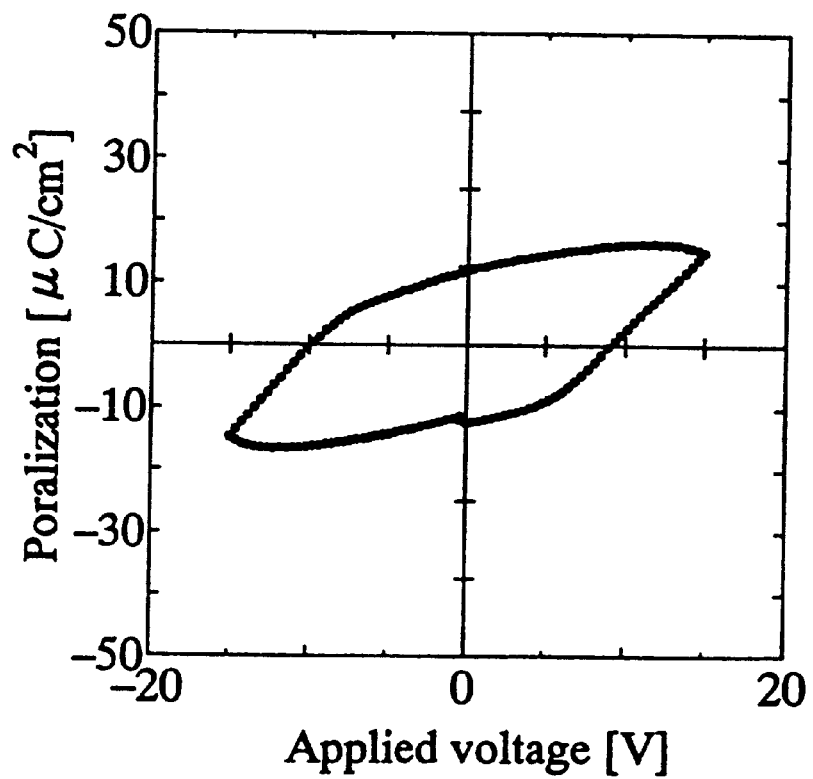
FIG. 15 shows a P-E hysteresis loop of the epitaxial PZT thin film produced in Comparative example 2.

FIG. 15 shows a P-E hysteresis loop of the epitaxial PZT thin film according to Comparative Example 2. FIG. 15 shows that the residual polarization is very small due to poor crystallinity and that resistant voltage is significantly large due to the existence of the oxide layer between the PZT thin film and the TAN thin film.

COMPARATIVE EXAMPLE 3

A TAN ($Ti_{0.9}Al_{0.1}N$) thin film with a thickness of about 100 to 500 nm was epitaxially grown on an Si single-crystal substrate by means of the PLD method under the same conditions as that employed in Example 1.

Figure 16:
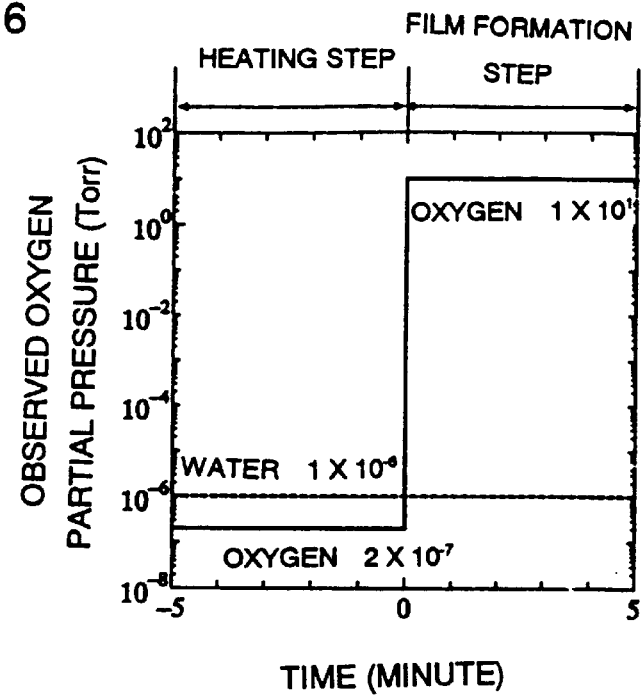
FIG. 16 shows an observed-oxygen partial pressure and a water partial pressure during the formation of the PZT thin film in Comparative example 3.
Figure 17:
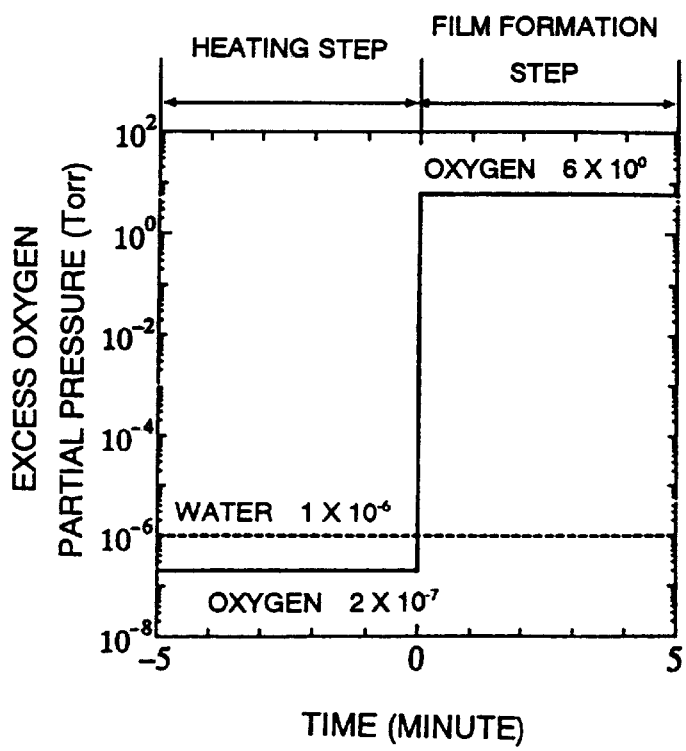
FIG. 17 shows an excess-oxygen partial pressure and a water partial pressure during the formation of the PZT thin film in Comparative example 3.

Then, the substrate was heated to reach to 700° C. while the oxygen partial pressure and the water partial pressure maintained at $2\times10^{-7}$ Torr and $1\times10^{-6}$ Torr, respectively, as shown in FIGS. 16 and 17.

Thereafter, the PZT thin film was formed on the TAN thin film, at the observed oxygen partial pressure of 10 Torr and at the excess-oxygen partial pressure of 6 Torr. Note that the observed oxygen partial pressure and the excess-oxygen partial pressure were constant during the PZT thin film formation and thus, no initial layer of PZT was formed.

Figure 18:
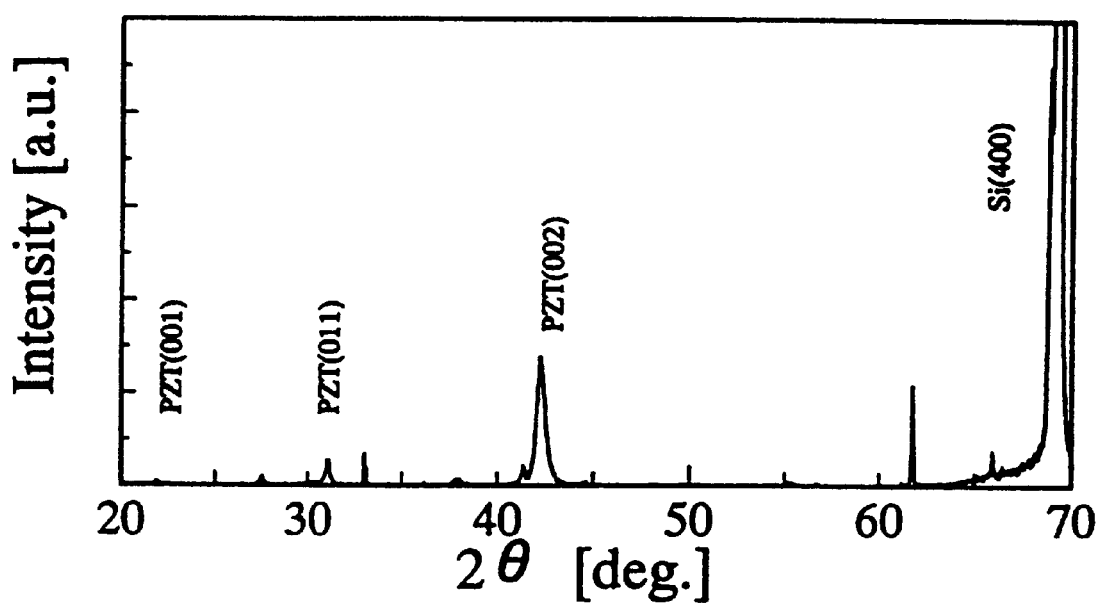
FIG. 18 shows an XRD pattern of an epitaxial PZT thin film produced in Comparative example 3.

FIG. 18 illustrates an XRD pattern of the epitaxial PZT thin film formed on the TAN thin film according to Comparative Example 3. FIG. 18 shows that the PZT thin film according to Comparative Example 3 has a perovskite structure, but has no orientational properties.

According to Comparative Example 3, the oxygen partial pressure was maintained at $2\times10^{-7}$ Torr during heating the substrate. Thus, no substantial oxidation of the TAN thin film occurred during the heating step. However, when the PZT thin film was formed, the TAN thin film was exposed to the atmosphere in which the excess-oxygen partial pressure was at 6 Torr. Thus, it is thought that before the TAN was covered with the PZT thin film, the surface of the TAN thin film was oxidized and that the PZT film could not be grown epitaxially.

EXAMPLE 2

Figure 19:
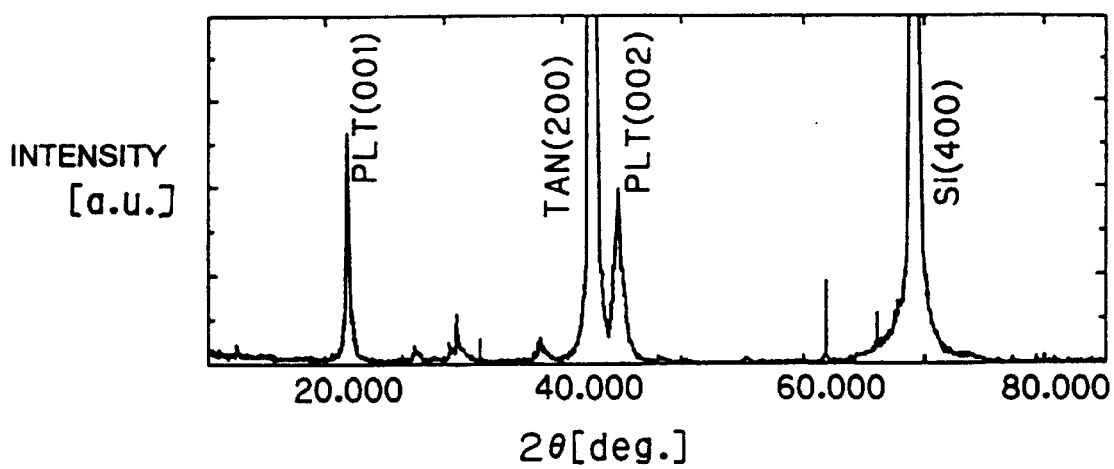
FIG. 19 shows an XRD pattern of an epitaxial PLT thin film produced in Example 2.

A TAN thin film ($Ti_{0.7}Al_{0.3}N$) was epitaxially grown on an Si substrate by means of a PLD process in a similar manner to the Example 1. On this TAN thin film, a PLT ($Pb_{0.9}La_{0.1}TiO_3$) thin film with a thickness of about 500 to 800 nm was epitaxially grown by means of a PLD process under conditions of a pressure of 5 Torr ($O_2$ ambient); a substrate temperature of 500° C.; a laser repetition frequency of 5 Hz; and a laser energy density of 4.5 J/cm² (KrF). During raising the substrate temperature to 500° C., the atmosphere to which the TAN thin film was exposed was maintained so that the oxygen partial pressure and the water partial pressure are at $1\times10^{-5}$ Torr and $1\times10^{-5}$ Torr or less, respectively. As for the target used to form the PLT thin film, a sintered ceramic target with a composition of $Pb_{0.9}La_{0.1}TiO_3$ was employed. FIG. 19 shows an XRD pattern of the obtained epitaxial PLT thin film and shows that it is also possible to epitaxially grow a PLT thin film with a high-degree of orientation on an Si substrate in accordance with the ferroelectric thin film production method of the present invention.

EXAMPLE 3

Figure 20:
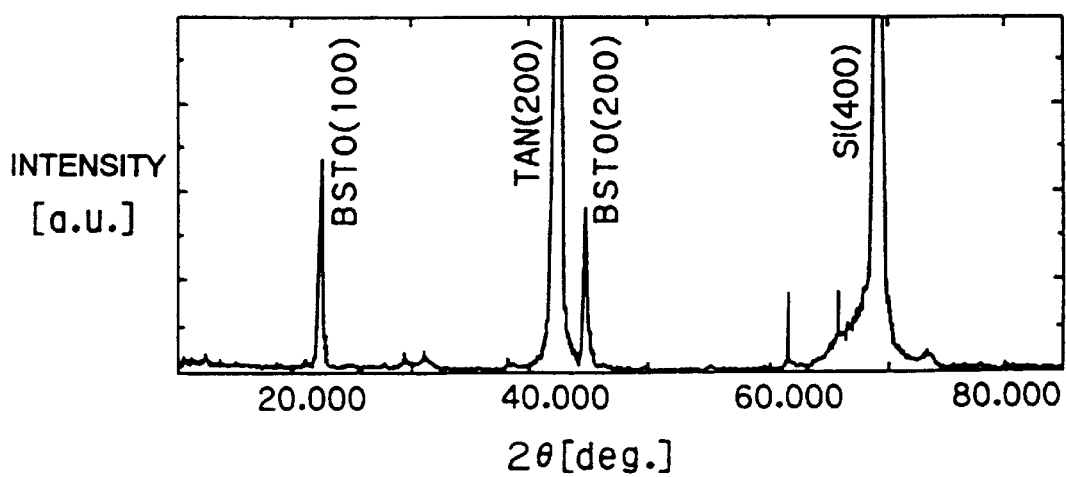
FIG. 20 shows an XRD pattern of an epitaxial BSTO thin film produced in Example 3.

A TAN thin film ($Ti_{0.99}Al_{0.01}N$) was epitaxially grown on an Si substrate by means of a PLD process in a similar manner to the Example 1. On this TAN thin film, a BSTO ($Ba_{0.7}Sr_{0.3}TiO_3$) thin film with a thickness of about 500 to 800 nm was epitaxially grown by means of a PLD process under conditions of a pressure of $10^{-4}$ Torr; a substrate temperature of 600° C.; a laser repetition frequency of 5 Hz; and a laser energy density of 4.5 J/cm² (KrF). During raising the substrate temperature to 600° C., the atmosphere to which the TAN thin film was exposed was maintained so that the oxygen partial pressure and the water partial pressure are at $1\times10^{-5}$ Torr and $1\times10^{-5}$ Torr or less, respectively. As for the target used to form the BSTO thin film, a sintered ceramic target with a composition of $Ba_{0.7}Sr_{0.3}TiO_3$ was employed. FIG. 20 shows an XRD pattern of the obtained epitaxial BSTO thin film and shows that it is also possible to epitaxially grow a BSTO thin film with a high-degree of orientation on an Si substrate in accordance with the ferroelectric thin film production method of the present invention.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ferroelectric thin film device comprising:
    an Si substrate;
    a TiN thin film whose Ti component is partially replaced with Al, on said Si substrate; and
    a ferroelectric thin film of a perovskite oxide on said TiN thin film,
    wherein the amount of Al atoms present at Ti sites of said TiN thin film is within the range from about 1% to 30% and the oxygen atomic content of said TiN thin film is equal to or less than about 5%.

2. A ferroelectric thin film device according to claim 1, wherein the amount of Al atoms present at Ti sites of said TiN thin film is within the range from about 5% to 20% and the oxygen atomic content of said TiN thin film is equal to or less than about 1%.

3. A ferroelectric thin film device according to claim 1, wherein the thickness of said TiN thin film is about 100 to 500 nm and the thickness of said ferroelectric thin film is about 400 to 800 nm.

4. A ferroelectric thin film device according to claim 1, wherein said TiN thin film is epitaxially grown and said ferroelectric thin film is orientationally ordered.

5. A ferroelectric thin film device according to claim 4, wherein said ferroelectric thin film is a Pb-based perovskite.

6. A ferroelectric thin film device according to claim 1, wherein said ferroelectric thin film is a Pb-based perovskite.

7. A ferroelectric thin film device according to claim 1, wherein said ferroelectric thin film is a perovskite represented by the formula of $ABO_3$, where A is Pb or Pb and at least La and B is at least one element selected from the group consisting of Ti, Zr, Mg and Nb.

8. A ferroelectric thin film device according to claim 1, wherein said ferroelectric thin film is epitaxial.

9. A ferroelectric thin film device according to claim 1, wherein said TiN thin film is a laser deposition film.

10. A ferroelectric thin film device according to claim 1, wherein said ferroelectric thin film is a chemical vapor deposition film.

* * * * *